United States Patent

Urbansky

[11] Patent Number: 6,075,387
[45] Date of Patent: Jun. 13, 2000

[54] PHASE DETECTOR

[75] Inventor: Ralph Urbansky, Schwaig, Germany

[73] Assignee: Lucent Technologies Inc., Murray Hill, N.J.

[21] Appl. No.: 09/054,591

[22] Filed: Apr. 3, 1998

[30] Foreign Application Priority Data

Apr. 5, 1997 [DE] Germany ............... 197 14 142

[51] Int. Cl.[7] .................................... H03L 7/085
[52] U.S. Cl. ........................ 327/2; 327/7; 327/12
[58] Field of Search ................ 327/2, 3, 7, 8, 327/12

[56] References Cited

U.S. PATENT DOCUMENTS 5,475,718  12/1995  Rosenkranz ................... 375/376
5,907,253   5/1999  Davis et al. .................. 327/156

Primary Examiner—Tuan T. Lam

[57] ABSTRACT

The invention relates to a phase detector, especially for a Phase Locked Loop of a desynchronizer of a digital transmission system for the transmission of signals of the synchronous digital hierarchy with a difference former (subtractor) connected to a comparator, to which can be conducted at the input side, via a first accumulator, a first input signal, and via a second accumulator a second input signal with the comparator being connected at the output side via a coder to a control input of the second accumulator.

10 Claims, 2 Drawing Sheets

PHASE DETECTOR

BACKGROUND OF THE INVENTION

1. Field of the Invention

The invention relates to a phase detector, especially for a phase locked loop (PLL).

2. Description of the Prior Art

Within a phase locked loop, e.g. the (hybrid) one known from the European Patent 0 391 464 B1, a phase detector compares the phase position of a nominal frequency of an external signal to the oscillator frequency of a signal generated by a voltage-controlled oscillator VCO, and delivers a signal which represents a phase deviation or shift. This signal is low pass filtered and converted in an analog/digital converter before it is conducted to a regulator. The output signal of the regulator, converted in a digital/analog converter, is conducted to the oscillator as a control voltage.

SUMMARY OF THE INVENTION

It is the purpose of the invention to realize on one hand the function of analog/digital conversion with as low as possible a number of active analog components, and, at the same time, to make possible integrated low pass or anti-aliasing filtering for subsequent digital or time-discrete processing. On the other hand, it is attempted to realize the analog/digital conversion functionally as a so-called sigma-delta-modulation of the first or second order, because this modulation or conversion principle is free of the extremely highly problematical non-linearities which occur with a conventional multibit converter (A/D converter). Of disadvantage, however, with the sigma-delta concept is the customarily provided application of analog integrators, e.g. operational amplifiers wired with RC elements.

Thus the purpose of the invention is to indicate a phase detector, especially with analog/digital conversion, which is constructed especially simply and with as low as possible a number of active analog components.

According to the invention this purpose is fulfilled through a phase detector which comprises a difference former (or subtractor) connected before a comparator, the two signal or clock inputs of the difference former being each connected to an accumulator, where, for the formation of an internal control loop, the comparator is connected at its output via a (first) coder to the control input of that (second) accumulator to which is conducted the input frequency to be synchronized. The coder can also transmit further the output signal of the comparator, i.e. the comparator signal, directly to the (second) accumulator. Each and every accumulator is suitably constructed of a (first) adder and a (first) register.

For the purpose of transforming each and every comparator signal formed by comparing the difference forming signal to a threshold value, in an advantageously configured formation a (second) coder is connected after the comparator, with an evaluation unit being connected to the other side [of the coder]. Thereby one or two decision threshold values can be provided in the comparator, whereby with only one single decision threshold the uncorrected accumulator increments cause the threshold value to be exceeded.

The comparator is preferably designed for the processing of digital signals. Yet it is also possible to replace it by a comparator which processes analog input signals, yet produces binary output signals. To that end it is expedient to connect between the difference former and the comparator a series connection of a (second) digital/analog converter and a low pass filter, as well as a (second) adder with the possibility of conducting a modulation signal to this adder. Alternatively it is possible to connect between the difference former and the comparator a series connection of a (second) digital/analog converter and a (second) adder, as well as an integrator, with the output of the comparator being connected to this adder. With this alternative it is expedient to connect the comparator via a (third) coder that can be clocked by means of the second input frequency, [along with] a (third) adder, to the (second) adder. In the place of this (third) coder, it is also possible to provide a (second) register. Thereby the comparator in both alternatives comprises two operational amplifiers connected in parallel, to each of which a reference voltage can be conducted.

The phase detector is of particular advantage when applied in a phase locked loop of a desynchronizer or synthesizer of a transmission device for the synchronous digital hierarchy. Within the phase locked loop, then, the loop is closed via a regulator, followed by a (first) digital/analog converter and a voltage-controlled oscillator (VCO), by connecting that latter at its output to the second accumulator of the phase detector.

Examples of execution of the invention are explained in detail based on the diagram.

BRIEF DESCRIPTION OF THE DRAWINGS

Mutually corresponding parts are indicated in all FIGS. by the same references.

DETAILED DESCRIPTION

Figure 1:
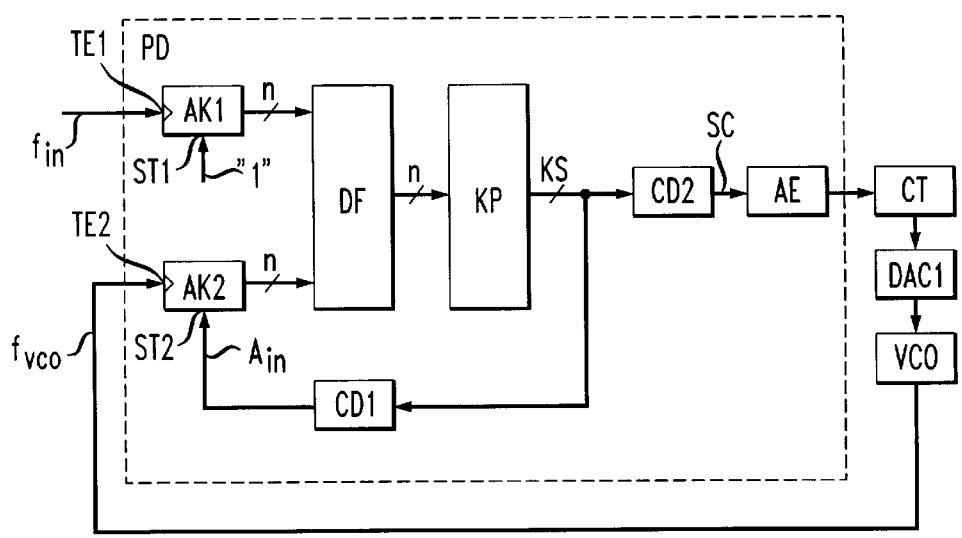
FIG. 1 is the circuit construction of a digital phase detector with analog/digital conversion in a phase locked loop.

FIG. 1 shows a phase control circuit PLL (Phase Locked Loop) with a phase detector PD and with a regulator or controller CT connected after it, as well as a first analog/digital converter DAC and with a voltage-controlled oscillator VCO, the oscillator clock of which, for closing the control loop of the phase locked loop PLL, is conducted to the input side of the phase detector PD as second input frequency $f_{vco}$. To the phase detector PD there is conducted at its input side, in addition, a first input frequency $f_{in}$ as reference frequency.

The first input frequency $f_{in}$ is conducted to the clock input TE1 of a first accumulator AK1, the control input ST1 of which receives the value "1" in the example of execution. The output frequency $f_{vco}$ of the voltage-controlled oscillator VCO is conducted as input frequency to the clock input TE2 of a second accumulator AK2. Via the control input ST2 of the latter, the incrementation is set so that the accumulated value is increased at the arrival of the next clock pulse edge of the input frequency $f_{vco}$. A difference former DF connected after the accumulators AK1 and AK2 forms the difference between the values issued by the two accumulators AK1 and AK2, taking into account the modulo-n-manner of counting of the accumulators AK1 and AK2.

A comparator KP connected after the difference former DF compares this difference to a given decision threshold, which in the example of execution has the value "0", and issues a comparator signal KS. This means that when the decision threshold is exceeded, the output of the comparator KP issues a comparator signal KS with the signal value of "1". Otherwise the signal value of '0" is issued. This comparator signal KS is conducted to a first coder CD1. That latter issues, in turn, a control value as output or control signal $A_{in}$ and thus feeds the control input ST2 of the second accumulator AK2, so that the first coder CD1 completes an internal control loop. Since only one decision threshold is available, the accumulator increments are chosen so that they cause without correction an exceeding of the decision threshold. The exceeding of the decision threshold leads to the correction of the accumulator increment and thus to the subsequent falling below the decision threshold.

The first accumulator AK1 is in this example of execution functionally a counter which causes a rise of the phase difference. The output values of this first accumulator AK1 increment in units of 0.5 UI, with UI being a unit interval with 1 UI=2 π. As the lowest value bit (LSB=Least Significant Bit) only 1 UI must be conducted out. The second accumulator AK2 receives at first the control value "0" at the control input ST2 with the control signal $A_{in}$ of the first coder CD1, and does not change its output value. The rise of the phase difference leads to exceeding the critical threshold of the comparator KP and to the control value "1" in the control signal $A_{in}$ at the second accumulator AK2. The latter can thereby indicate increments of 0 or 1 UI.

With a nominal input frequency $f_{in}$ there results a correction process for every second clock pulse. In a second coder, CD2, connected after the comparator KP, which is connected ahead of an evaluation unit AE, this is considered through subtraction of the value 0.5. As described below, the phase detector PD can be supplemented with a threshold modulator to improve the resolution.

Figure 2:
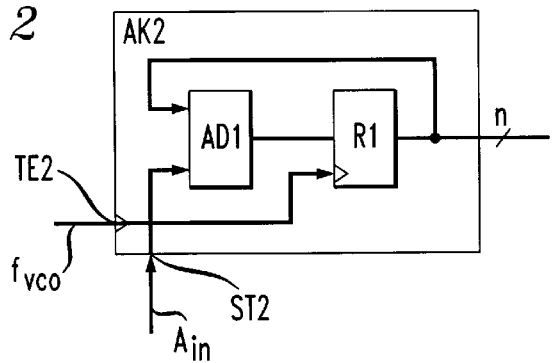
FIG. 2 is the circuit construction of an accumulator of the phase detector according to FIG. 1.

FIG. 2 shows the construction e.g. of the accumulator AK2. The accumulator AK2 comprises a first adder AD1 and a first register R1. The clock input of the register R1 corresponds to the clock input TE2 of the accumulator AK2. The output of the register R forms the output of the accumulator AK2 and is conducted to a first input of the adder AD1. The second input of the adder AD1 is connected to the control input ST2 of the accumulator AK2. A clock pulse edge of the input frequency $f_{vco}$ at the clock input TE2 causes the rise (modulo n) of the accumulator output value by the control value extant at this point in time at the control input ST2. The control value "0" at the control input ST2 keeps the accumulator output value constant, while the control value "1" results in the mode of operation of a counter.

Figure 3:
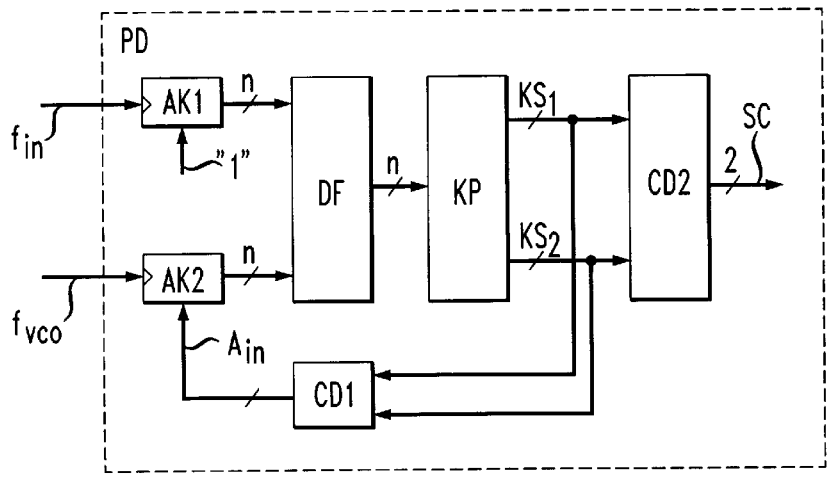
FIGS. 3 to 5 are circuit variants of the phase detector according to FIG. 1.

The phase detector PD in the example of execution according to FIG. 3 differs from the phase detector shown in FIG. 1 by the provision of two threshold values, e.g. the values "1" and '0". Here the comparator KP compares the difference formed by the difference-former DF to these threshold values, with an output of the comparator KP issuing in the case of exceeding the threshold value "1" a first comparison signal $KS_1$, while the other output KP issues, in case of falling below the second threshold value "0", a second comparator signal $KS_2$. The two comparator signals $KS_{1,2}$ are conducted to the first coder CD1 as well as to the second coder CD2. The first coder CD1 forms from it again the control signal $A_{in}$ for the control input ST2 of the second accumulator AK2, and thus closes the control loop. The control maintains the mean phase difference value at the output of the difference former DF within the threshold values of "1" and "0" of the comparator KP.

The second coder CD2 transforms the comparator signals $KP_{1,2}$ into a binary signal SC, which can be processed further by the evaluation unit AE, which operates e.g. as counter or as accumulator. The coder signal SC, which has been transformed through the coding in the second coder CD2, indicates the average frequency deviation between the input frequencies $f_{in}$ and $f_{vco}$. After accumulation in the evaluation unit AE the phase deviation results.

Figure 4:
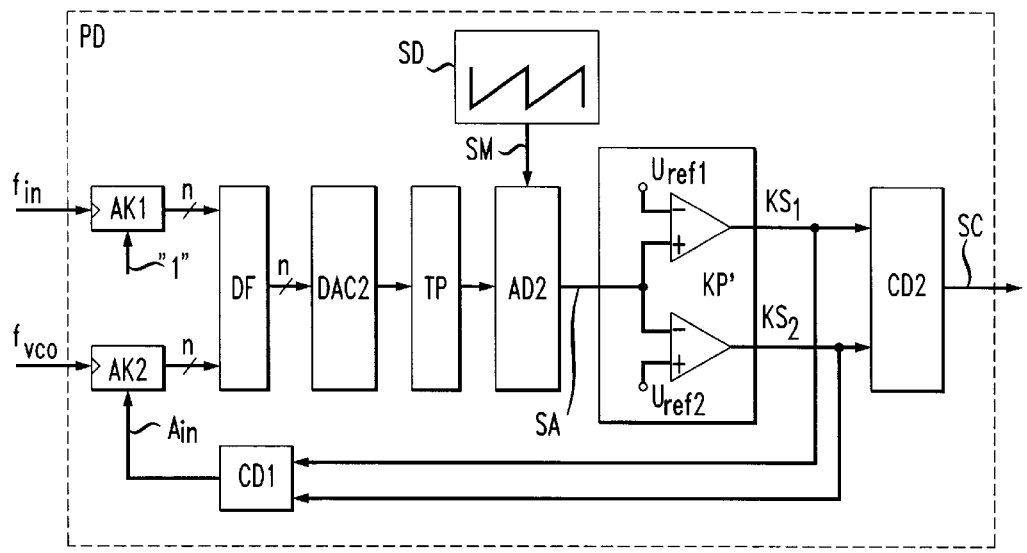

The phase detector PD according to FIG. 4 differs from the phase detector PD according to the FIGS. 1 and 3 by the addition of blocks between the difference former DF and the comparator KP. Furthermore the digital comparator KP according to FIG. 1 has been replaced by a comparator KP' with an analog input SA, constructed with one of two operational amplifiers OP1 and OP2. The significance of the binary output signals $KS_{1,2}$ of the analog comparator KP' remains unchanged as against that of the digital comparator KP.

The phase difference issued by the difference former DF is conducted to a (second) digital/analog converter DAC2. At that the voltage $U_{LSB}$ corresponds to the least significant bit 1 UI of the phase difference. The analog-converted signal is subsequently smoothed in a low pass filter TP. The limit frequency when applied in such a phase locked loop, should be located above the PLL (phase locked loop) limit frequency, yet below the signal frequencies $f_{in}$, $f_{vco}$ of the input signals of the phase detector PD. The combination of the digital/analog converter DAC2 and the low pass filter TP can be realized through a number of resistors, e.g. for n=2 through two resistors, and one capacitor.

In a (second) adder block AD2, a further signal SM from a threshold modulator SD is superimposed onto the low-pass-filtered signal. The amplitude of this modulation signal SM should correspond to e.g., $U_{SS} \approx 1\ U_{LSB}$. This phase difference signal, smoothed by the low pass filtering, passes, due to the overlaying of the modulation signal SM, the decision thresholds of the following comparator KP'. The decision thresholds or reference signals could, e.g., by located at $U_{ref1}$=0,5 $U_{LSB}$ and $U_{ref2}$=-0,5 $U_{LSB}$. If, e.g. a constant phase difference signal is overlaid by a saw tooth shaped modulation signal SM, there results after recoding a pulse width modulated binary equivalent of the analog phase difference signal. Through the low pass characteristic of the phase locked loop circuit PLL or a (not shown) evaluation or indicator circuit the pulse width modulated phase difference signal is transformed into a smoothed signal with high resolution, i.e. UI is smaller than one.

In place of overlaying the modulation signal SM onto the phase difference signal before or after low pass filtering, it is possible to modulate the reference signals $U_{ref1,2}$ of the comparator KP'. Thereby, the difference of the reference signals $U_{ref1,2}$ should continue to amount to 1 $U_{LSB}$.

Figure 5:
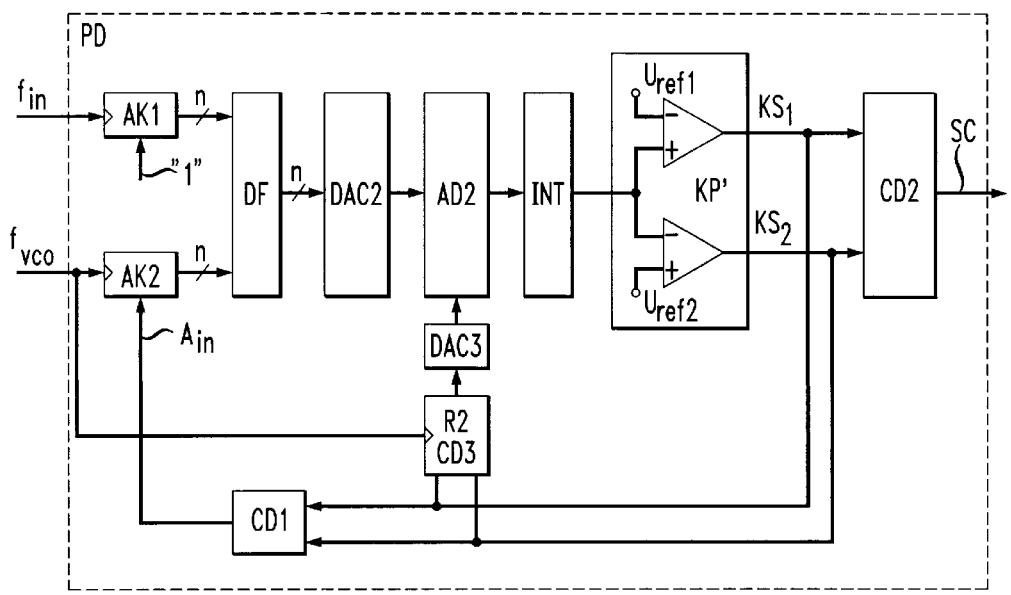

The phase detector PD shown in FIG. 5 is based on the phase detector PD according to FIG. 4. The digital-analog converter DAC2 of e.g. 2 bits, i.e. two resistors, is followed by the (second) adder AD2, e.g. in the form of a resistor, which overlays the voltage values 1 $U_{LSB}$, 0, or -1 $U_{LSB}$, depending on the comparator values. In addition, the adder AD2 is connected at its input via a (third) digital/analog converter DAC3 and a (third) coder CD3 or a (second) register R2 to the comparator KP', with the second input frequency $f_{vco}$ being conducted coder CD3 or to the register R2 as clock signal. The overlaying in the adder AD2 is delayed by one clock period, i.e. by one register, so that the effect on the summation point, realized through the adder AD2, occurs simultaneously with the correction of the accumulation.

An integrator INT following the adder AD2, in the form of an operational amplifier or of a charge pump and a capacitor, integrates the summation signal and issues a decision value to the comparator KP'. By the thus obtained twofold integration in the control loop, i.e. on one hand by the accumulator AK2, and, on the other hand, by the integrator INT, the quantization error of the comparator KP', the spectrum of which is constant (white noise), is differentiated twice discretely. Each and every comparator signal $KS_{1,2}$, quantized by the comparator KP', is integrated to form the phase difference value. The phase quantization error thus corresponds to once differentiated white noise. By this all low frequency spectral components of the phase quantization error are suppressed. The resulting quantization error is determined by the low pass effect of a subsequent indication unit or by the PLL limit frequency.

In all shown circuits it is possible to change the frequency ratio (PLL application) of the coder signal SC through addition of a digital value issued by the second coder CD2 to the value of the coder signal SC in the accumulator AK2. In the circuit with only one threshold value according to FIG. 1, the second coder CD2, which subtracts from the comparator value the value 0.5, can be replaced by an adder which carries out this addition, to set the frequency ratio.

With the phase detector PD according to the invention the number of components which cannot be integrated into a digital ASIC (Application Specific Integrated Circuit) is minimized. In addition, in this phase detector PD the sigma-delta modulation or conversion method is included. Particularly advantageous is the possible application of the phase detector PD in frequency synthesizers. Also, no supplementary analog/digital converter is required, because this function is already fulfilled by the enlarged phase detector PD. In addition, with this phase detector PD no uncorrelated clock is needed. Furthermore, the number of external active analog components for the analog/digital conversion is small.

Through the twofold differentiation, and thus spectral forming of the quantization error regarding the frequency, the high frequency components regarding the phase are attenuated. By overlaying a constant signal, e.g. the modulation signal SM, behind the difference former DF, it is possible to move the output frequency "continually" off-tune. This is particularly advantageous for application in a synthesizer.

| List of Reference Symbols | |
|---|---|
| AK | accumulator |
| AD | adder |
| CD | coder |
| CT | controlling means |
| DAC | digital/analog converter |
| DF | difference former |
| INT | integrator |
| KP | comparator |
| R | register |
| TP | low pass filter |
| SD | threshold modulator |
| TE | clock input |
| ST | control input |
| $f_{in}$, $f_{VOC}$ | input frequency |
| $A_{in}$ | control signal |
| $U_{ref1,2}$ | reference signal |
| SA | input signal |
| SC | coder signal |
| SM | modulation signal |
| KS | comparator signal |

What is claimed is:

1. Phase detector, especially in a phase locked loop of a desynchronizer of a digital transmission system for the transmission of signals of the synchronous digital hierarchy, with a difference former having a first input terminal and a second input terminal connected in front of a comparator, a first accumulator coupled to feed an output signal to the first input terminal of the difference former and coupled to receive, a first input frequency and a second accumulator coupled to feed an output signal to the second input terminal of the difference former and coupled to receive a second input frequency, and a first coder coupled to receive an output signal from the comparator to generate a control signal coupled to a control input of the second accumulator.

2. The phase detector of claim 1, comprising a second coder being connected after the comparator, and an evaluation unit being connected after the second coder.

3. The phase detector of claim 1, wherein the second accumulator comprises a first adder and a first register.

4. The phase detector of claim 1, wherein the comparator compares the signal from the difference former with a given decision threshold signal to generate a first signal when the threshold is exceeded and a second signal when the threshold is not exceeded.

5. The phase detector of claim 1, further comprising, between the difference former and the comparator, there is connected a series connection of a first digital/analog converter, a low pass filter, and a second adder, and a threshold modulator coupled to feed a modulation signal to the second adder.

6. The phase detector of claim 1, further comprising a series connection of a first digital/analog converter, a second adder, and an integrator connected between the difference former and the comparator, the comparator being connected at its output to the second adder.

7. The phase detector of claim 6, wherein the comparator is connected via a third coder, which is coupled to be clocked by means of the second input frequency and a second digital/analog converter, to the second adder.

8. The phase detector of claim 6, wherein the comparator is connected, via a register that is coupled to be clocked by the second input frequency and via the second digital/analog converter, to the second adder.

9. The phase detector of claim 5, wherein the comparator comprises two mutually parallel operational amplifiers, each coupled to receive one reference voltage.

10. The device of claim 1, further comprising an evaluation unit, a second coder interposed between the evaluation unit and the comparator, a controller coupled to receive a signal from the evaluation unit, as well as with a subsequently connected first digital/analog converter and a voltage controlled oscillator connected after this latter one, the output of the voltage controlled oscillator being connected at its output to the second accumulator.

* * * * *